(12) United States Patent
Huang et al.

(10) Patent No.: US 11,005,080 B2
(45) Date of Patent: May 11, 2021

(54) ORGANIC LIGHT EMITTING DIODE DISPLAY SCREEN AND MANUFACTURING METHOD THEREOF

(71) Applicant: Wuhan China Star Optoelectronics Semiconductor Display Technology Co., Ltd., Wuhan (CN)

(72) Inventors: Xiaowen Huang, Wuhan (CN); Wenliang Gong, Wuhan (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 0 days.

(21) Appl. No.: 16/611,485

(22) PCT Filed: Sep. 11, 2019

(86) PCT No.: PCT/CN2019/105243
§ 371 (c)(1),
(2) Date: Nov. 7, 2019

(87) PCT Pub. No.: WO2020/220554
PCT Pub. Date: Nov. 5, 2020

(65) Prior Publication Data
US 2020/0343488 A1    Oct. 29, 2020

(30) Foreign Application Priority Data
Apr. 29, 2019 (CN) .......................... 201910356808.6

(51) Int. Cl.
*H01L 51/52* (2006.01)
*H01L 51/56* (2006.01)
*H01L 27/32* (2006.01)

(52) U.S. Cl.
CPC ........ *H01L 51/5293* (2013.01); *H01L 27/322* (2013.01); *H01L 27/3246* (2013.01);
(Continued)

(58) Field of Classification Search
CPC .............. H01L 51/5293; H01L 27/322; H01L 27/3246; H01L 51/5284
See application file for complete search history.

(56) References Cited

U.S. PATENT DOCUMENTS

2018/0144944 A1* 5/2018 Jung ................... H01L 21/3083
2019/0123282 A1  4/2019 Bao et al.

FOREIGN PATENT DOCUMENTS

CN         104134758        11/2014
CN         105446037        3/2016
(Continued)

*Primary Examiner* — Changhyun Yi

(57) ABSTRACT

The present invention provides an OLED display screen and a manufacturing method thereof. The OLED display screen includes a substrate, a functional layer, and a polarizing layer including a photoresist layer. A concave-convex structure is disposed on a surface of the polarizing layer facing away from the functional layer. The manufacturing method of the OLED display screen includes the steps: forming a display panel and forming a polarizing layer. The invention adopts the polarizing layer instead of a polarizer, and designs the concave-convex structure on the surface of the polarizing layer, thereby reducing reflectance of the surface of the polarizing layer and improving light emitting rate of the light emitting layer. Moreover, the concave-convex structure can change light angles and increase viewing angles, thereby improving narrow viewing angles of current OLED display screens and issues affecting readability, and improving readability of OLED display screens under outdoor sunlight.

7 Claims, 3 Drawing Sheets

(52) U.S. Cl.
CPC ...... *H01L 51/5237* (2013.01); *H01L 51/5284* (2013.01); *H01L 51/56* (2013.01); *H01L 2227/323* (2013.01)

(56) References Cited

FOREIGN PATENT DOCUMENTS

| CN | 106784312 | 5/2017 |
| CN | 108427223 | 8/2018 |
| CN | 109686869 | 4/2019 |

\* cited by examiner

ORGANIC LIGHT EMITTING DIODE DISPLAY SCREEN AND MANUFACTURING METHOD THEREOF

RELATED APPLICATIONS

This application is a National Phase of PCT Patent Application No. PCT/CN2019/105243 having International filing date of Sep. 11, 2019, which claims the benefit of priority of Chinese Patent Application No. 201910356808.6 filed on Apr. 29, 2019. The contents of the above applications are all incorporated by reference as if fully set forth herein in their entirety.

FIELD AND BACKGROUND OF THE INVENTION

The invention relates to the field of display, and in particular, to an organic light emitting diode display screen and a manufacturing method thereof.

Organic light emitting diode (OLED) display technologies can be applied to flexible displays because of their self-illumination, low power consumption, light weight, and absence of liquid crystal flow layers. Flexible OLED displays typically comprise substrate-based thin film transistor (TFT) layers, light emitting layers, multilayer film-based encapsulation layers, and circular polarizers (POLs). For top-emitting OLED displays, circular polarizers can reduce the reflectivity of ambient light, increase contrast, and improve the readability of OLED displays, but the circular polarizers will also consume about 58% of the light at the same time. In addition, large thickness and brittle texture of the circular polarizers limit the development of dynamic bendable display products.

The use of a color filter (CF) instead of a POL is classified as a POL-less technique, which not only reduces a thickness of a functional layer from about 100 μm to about 5 μm, but also increases an OLED's light extraction rate from 42% to 60%.

In the functional layer of the color film, a black matrix (BM) covers a non-light emitting area to cover metal lines and electrodes, and serves to reduce the reflection of the panel. However, a polarized layer (R/G/B/BM) has a higher surface reflectance (reflectance of about 7.1%) and a lower contrast under strong light than the polarizer (reflectance of about 4.5%). The conventional black matrix has a high reflectivity, which limits optical performance of the color film technology and causes a problem of narrow viewing angles.

Therefore, it is necessary to provide a new organic light emitting diode display screen and a manufacturing method thereof to overcome the problems existing in the prior art.

An object of the present invention is to provide an organic light emitting diode display screen and a manufacturing method thereof, which can improve a light transmittance of a light emitting layer through a polarizing layer by reducing a reflectance of a black matrix, and can also improve a narrow viewing angle problem by a concave-convex structure.

In order to solve the above problem, an embodiment of present invention provides an organic light emitting diode (OLED) display screen, which comprises a substrate, a functional layer, and a polarizing layer. Specifically, the substrate comprises a first surface and a second surface disposed opposite to each other. The functional layer is disposed on the first surface of the substrate. The polarizing layer is disposed on a side of the functional layer facing away from the first surface of the substrate. Wherein the polarizing layer consists of a photoresist layer, and a concave-convex structure is disposed on a surface of the polarizing layer facing away from the functional layer.

Moreover, the OLED display screen further comprises an encapsulation layer disposed between the functional layer and the polarizing layer.

Moreover, the concave-convex structure has a sawtooth cross section.

Moreover, a groove or a protrusion of the concave-convex structure has a trapezoidal or cylindrical cross section.

Moreover, the functional layer comprises a thin film transistor layer and a light emitting layer. Specifically, the thin film transistor layer is disposed on the substrate, and the light emitting layer is disposed on a side of the thin film transistor layer facing away from the substrate.

Moreover, the light emitting layer comprises a pixel defining layer and a red-green-blue light emitting layer.

Moreover, the polarizing layer comprises a black photoresist layer and a red-green-blue filter layer. Specifically, the black photoresist layer is disposed correspondingly to the pixel defining layer, and the red-green-blue filter layer is disposed correspondingly to the red-green-blue light emitting layer.

Another embodiment of the present invention provides a manufacturing method of an organic light emitting diode (OLED) display screen, comprising the following steps:

forming a display panel: wherein the step provides a substrate on which a functional layer is formed; and forming a polarizing layer: wherein the polarizing layer is formed on a surface of the functional layer facing away from the substrate, and a concave-convex structure is disposed on a surface of the polarizing layer facing away from the functional layer.

Moreover, the step between forming the display panel and forming the polarizing layer further comprises: forming an encapsulation layer: wherein the encapsulation layer is formed on the surface of the functional layer facing away from the substrate, and the polarizing layer is formed on a surface of the encapsulation layer facing away from the functional layer.

Moreover, the step of forming the polarizing layer comprises:

forming a black photoresist layer: wherein a positive or negative black photoresist layer is applied on the encapsulation layer, and a first mask is used for exposure to carry out a patterning process; and a second mask is used to expose the remaining black photoresist layer to form the concave-convex structure on a surface;

proceeding a baking process; and forming a red-green-blue filter layer: wherein a positive or negative red-green-blue filter layer is applied on the encapsulation layer, and a third mask is used to expose the red-green-blue filter layer to form the concave-convex structure.

The technical effect of the present invention is to provide an organic light emitting diode (OLED) display screen and a manufacturing method thereof, which use a polarizing layer instead of a polarizing film, and design a concave-convex structure on a surface of the polarizing layer without increasing the number of exposure development and etching process, which reducing a reflectance of the surface of the polarizing layer while increasing a light extraction rate of the light emitting layer. Moreover, the concave-convex structure can change light angles, increase viewing angles, improve narrow viewing angles of the prior art, which can improve the problem that the prior art OLED display screen has narrow viewing angles and affects the readability, and improve the problem of poor readable ability under outdoor sunlight in the OLED display screen itself.

Figure 1:
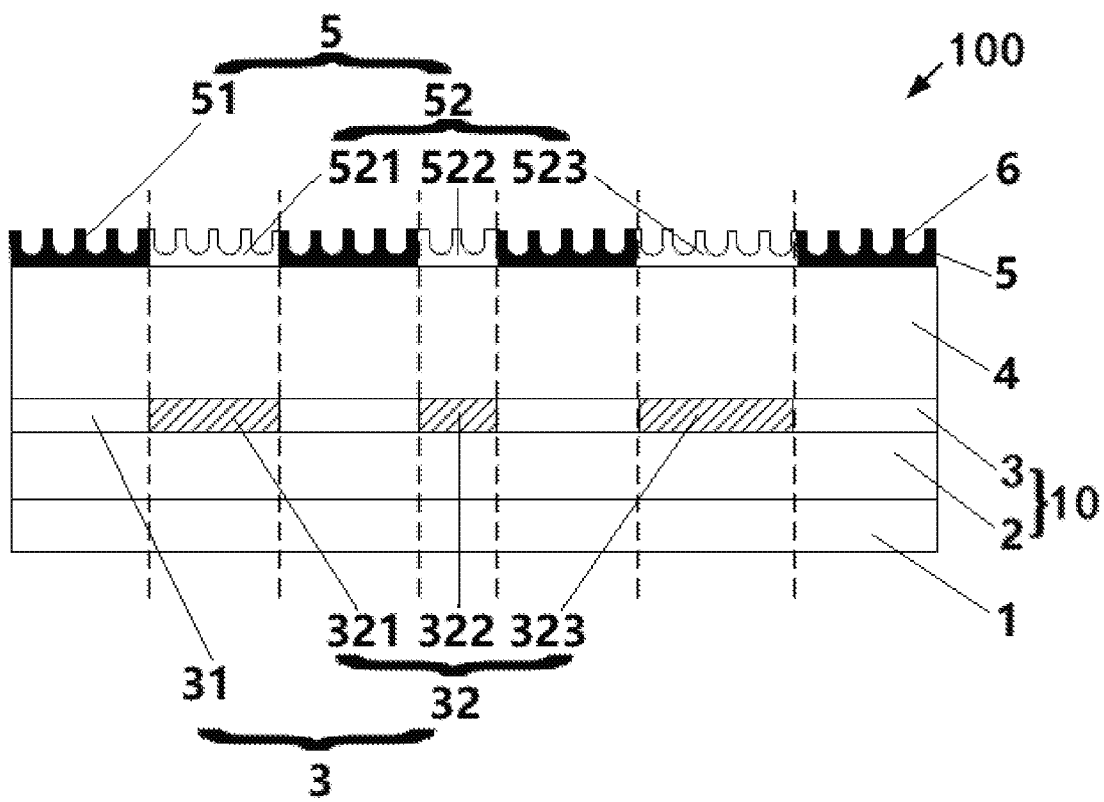
FIG. 1 is a schematic structural view of an organic light emitting diode (OLED) display screen according to an embodiment of the present invention.

The reference numerals in the figure are identified as follows:

1: substrate; 2: thin film transistor layer; 3: light emitting layer; 4: encapsulation layer; 5: polarizing layer; 6: concave-convex structure; 10: functional layer; 31: pixel defining layer; 32: red-green-blue light emitting layer; 51: black photoresist layer; 52: red-green-blue filter layer; 100: OLED display screen; 321: red light emitting layer; 322: green light emitting layer; 323: blue light emitting layer; 521: red filter layer; 522: green filter layer; 523: blue filter layer.

DESCRIPTION OF SPECIFIC EMBODIMENTS OF THE INVENTION

In the present invention, unless otherwise specifically defined and limited, the first feature is "on" or "under" the second feature may include that the first feature is in direct contact to the second feature, and may also include that the first feature and the second feature are not in direct contact but through additional features between them. Moreover, the first feature is "on," "above," and "under" the second feature includes the first feature is directly above and obliquely above the second feature, or merely indicating that the high of the first feature is higher than the second feature. The first feature is "below," "under," and "lower" the second feature includes the first feature is directly below and obliquely below the second feature, or merely indicating that the high of the first feature is less than the second feature.

In the present invention, identical or corresponding components are denoted by the same reference numerals, regardless of the figure number. In the specification, when a "first," "second," and the like may be the wording used to describe the various components, these components need not limited to the above wording. The above terms are only used to distinguish one element from another distinguished.

Referring to FIG. 1, an embodiment of the present invention provides an organic light emitting diode (OLED) display screen 100, which comprises a substrate 1, a functional layer 10, and a polarizing layer 5. Specifically, the substrate 1 comprises a first surface and a second surface disposed opposite to each other. The functional layer 10 is disposed on the first surface of the substrate 1. The polarizing layer 5 is disposed on a side of the functional layer 10 facing away from the first surface of the substrate 1. Wherein, the polarizing layer 5 consists of a photoresist layer, and a concave-convex structure 6 is disposed on a surface of the polarizing layer 5 facing away from the functional layer 10. Wherein, the OLED display screen 100 further comprises an encapsulation layer 4 disposed between the functional layer 10 and the polarizing layer 5.

In the embodiment, the concave-convex structure 6 has a sawtooth cross section. A groove or a protrusion of the concave-convex structure 6 has a trapezoidal or cylindrical cross section.

Designing the concave-convex structure 6 on the surface of the polarizing layer 5 not only reduces a reflectance of the surface of the polarizing layer but also increases a light extraction rate of the light emitting layer. Moreover, the concave-convex structure 6 can change light angles, increase viewing angles, and improve narrow viewing angles of the prior art, which can improve the problem that the prior art OLED display screen has narrow viewing angles and affects the readability, and improve the problem of poor readable ability under outdoor sunlight in the OLED display screen itself.

In the embodiment, the functional layer 10 comprises a thin film transistor layer 2 and a light emitting layer 3. Specifically, the thin film transistor layer 2 is disposed on the substrate 1, and the light emitting layer 3 is disposed on a side of the thin film transistor layer 2 facing away from the substrate 1. Wherein, the light emitting layer 3 comprises a pixel defining layer 31 and a red-green-blue light emitting layer 32. The polarizing layer 5 comprises a black photoresist layer 51 disposed correspondingly to the pixel defining layer 31, and a red-green-blue filter layer 52 disposed correspondingly to the red-green-blue light emitting layer 32. The concave-convex structure 6 is disposed on an upper surface of the black photoresist layer 51 and the red-green-blue filter layer 52, that is, a side facing away from the encapsulation layer 4.

Designing the concave-convex structure 6 on the surface of the black photoresist layer 51 can increase contact areas of the ambient light with the black photoresist layer 51, increase the absorption of light by the black photoresist layer 51, and reduce a specular reflection. The concave-convex structure 6 on the surface of the red-green-blue filter layer 52 can improve the brightness of the OLED display screen 100, so that the screen contrast is improved. The concave-convex structure 6 on the surface of the red-green-blue filter layer 52 is similar to a prism, and can change the light angle of the lower layer of the OLED display screen 100, and increase the viewing angles and improve the readability.

In the embodiment, the red-green-blue light emitting layer 32 specifically comprises a red light emitting layer 321, a green light emitting layer 322, and a blue light emitting layer 323. There are pixel defining layers 31 disposed between the red light emitting layer 321, the green light emitting layer 322, and the blue light emitting layer 323.

In the embodiment, the red-green-blue filter layer 52 comprises a red filter layer 521, a green filter layer 522, and a blue filter layer 523. There are black photoresist layers 51 disposed between the red filter layer 521, the green filter layer 522, and the blue filter layer 523, and the black photoresist layers 51 are disposed correspondingly to the pixel defining layers 31.

In the embodiment, the substrate 1 comprises a flexible substrate polyimide (PI) or a rigid glass substrate. The material of the substrate 1 is preferably polyimide, which has flexibility.

In the embodiment, the polarizing layer 5 consists of a color film substrate and a polarizer, which can realize a polarizing function, and can improve the performance without adding new materials and new processes, and has operability and cost saving.

Figure 2:
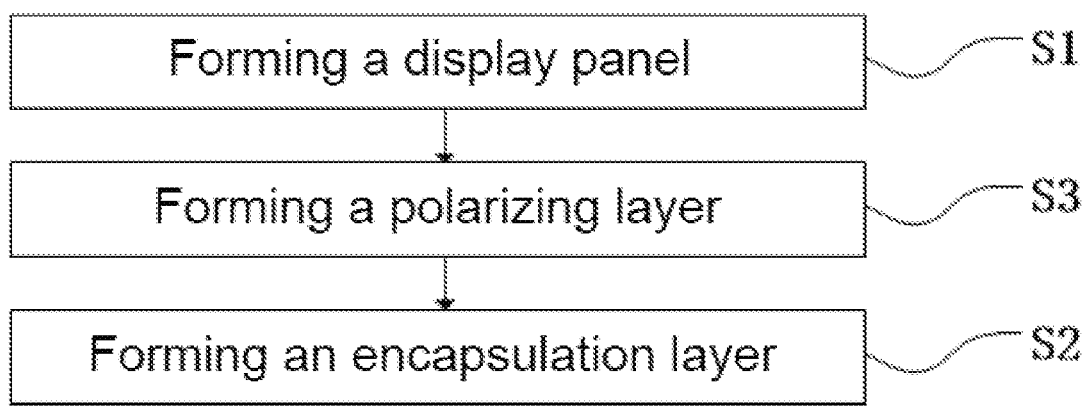
FIG. 2 is a flow chart of manufacturing the OLED display screen according to an embodiment of the present invention.

Referring to FIG. 2, the present invention further provides a manufacturing method of the organic light emitting diode (OLED) display screen 100, comprising the following steps:

S1: Forming a display panel, wherein the step provides a substrate 1 on which a functional layer 10 is formed; and S2: Forming a polarizing layer 5, wherein the polarizing layer 5 is formed on a surface of the functional layer 10 facing away from the substrate 1, and a concave-convex structure 6 is disposed on a surface of the polarizing layer 5 facing away from the functional layer 10.

Please refer to FIG. 2, in the embodiment, the step between forming the display panel and forming the polarizing layer further comprises:

S3: Forming an encapsulation layer 4, wherein the encapsulation layer 4 is formed on the surface of the functional layer 10 facing away from the substrate 1, and the polarizing layer 5 is formed on a surface of the encapsulation layer 4 facing away from the functional layer 10.

Figure 3:
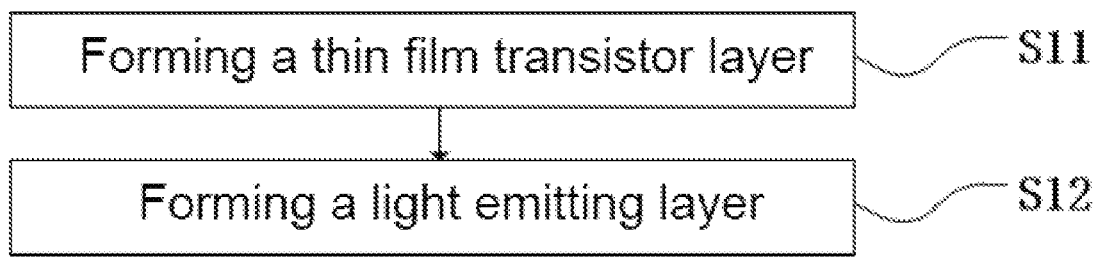
FIG. 3 is a flow chart of manufacturing a functional layer in an embodiment of the present invention.

Referring to FIG. 3, in the embodiment, in the step S1 of manufacturing the display panel, the step of forming the functional layer 10 comprises:

S11: Forming a thin film transistor layer 2, wherein the thin film transistor layer 2 is formed on the substrate 1; and S12: Forming a light emitting layer 3, wherein the light emitting layer 3 is formed on the thin film transistor layer 2.

Figure 4:
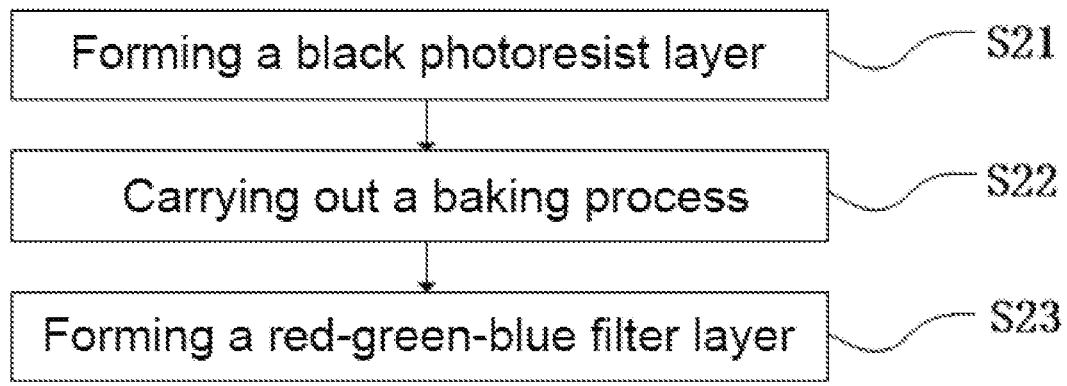
FIG. 4 is a flow chart of manufacturing a polarizing layer according to an embodiment of the present invention.
Figure 5:
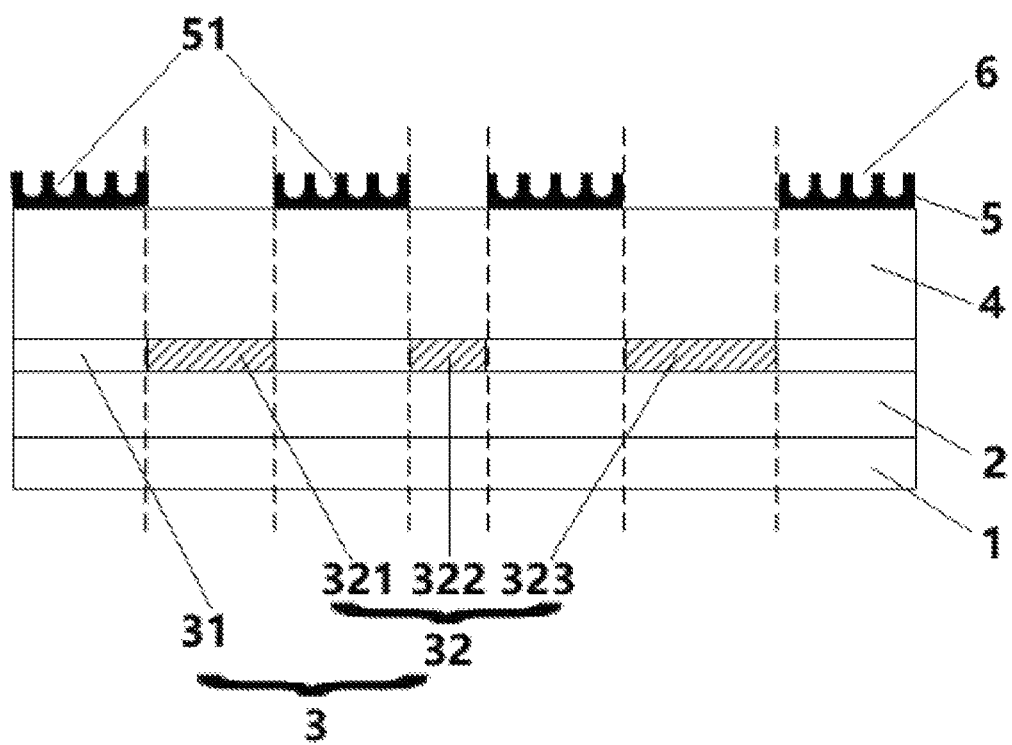
FIG. 5 is a schematic structural view of a semi-finished product of a black photoresist layer in an embodiment of the present invention.

Referring to FIG. 4, in the embodiment, the step S2 of forming the polarizing layer 5 comprises:

S21: Forming a black photoresist layer 51, wherein a positive or negative black photoresist layer 51 is applied on the encapsulation layer 4, and a first mask (not shown) is used for exposure to carry out a patterning process; and a second mask (not shown) is used to expose the remaining black photoresist layer 51 to form the concave-convex structure 6 on a surface;

S22: Carrying out a baking process; and

S23: Forming a red-green-blue filter layer 52, wherein a positive or negative red-green-blue filter layer 52 is applied on the encapsulation layer 4, and a third mask (not shown) is used to expose the red-green-blue filter layer 52 to form the concave-convex structure 6.

In the embodiment, the black photoresist layer 51 and the red-green-blue filter layer 52 have corresponding positive or negative properties. The conventional mask is used for the exposure and development etching process, and the exposure amount is reduced compared with the normal full curing exposure, forming a weak exposure. Adjust the developing section of the developing machine or the pressure of the vapor two fluids so that the surface of the remaining film layer is developed or washed away. Fixed equipment parameters and process conditions can achieve a uniform surface roughness, so there is no need to increase the number of exposure development and etching processes.

An advantage of the present invention is to provide an OLED display screen and a manufacturing method thereof, which use a polarizing layer instead of a polarizing film, and design a concave-convex structure on a surface of the polarizing layer without increasing the number of exposure development and etching process, which reduces a reflectance of the surface of the polarizing layer while increasing a light extraction rate of the light emitting layer. Moreover, the concave-convex structure can change light angles, increase viewing angles, and improve narrow viewing angles of the prior art, which can improve the problem that the prior art OLED display screen has narrow viewing angles and affects the readability, and improve the problem of poor readable ability under outdoor sunlight in the OLED display screen itself.

In the above, various other corresponding changes and modifications can be made according to the technical solutions and technical ideas of the present invention by those skilled in the art, and all such changes and modifications are within the scope of the claims of the present invention.

What is claimed is:

1. An organic light emitting diode (OLED) display screen, comprising:
   a substrate comprising a first surface and a second surface disposed opposite to each other;
   a functional layer disposed on the first surface of the substrate;
   an encapsulation layer disposed on a surface of the functional layer facing away from the substrate, and
   a polarizing layer disposed on a surface of the encapsulation layer facing away from the functional layer;
   wherein the polarizing layer consists of a photoresist layer, and a concave-convex structure disposed on a surface of the polarizing layer facing away from the encapsulation layer.

2. The OLED display screen as claimed in claim 1, wherein the concave-convex structure has a sawtooth cross section.

3. The OLED display screen as claimed in claim 1, wherein a groove or a protrusion of the concave-convex structure has a trapezoidal or cylindrical cross section.

4. The OLED display screen as claimed in claim 1, wherein the functional layer comprises:
   a thin film transistor layer disposed on the substrate; and
   a light emitting layer disposed on a side of the thin film transistor layer facing away from the substrate.

5. The OLED display screen as claimed in claim 4, wherein the light emitting layer comprises a pixel defining layer and a red-green-blue light emitting layer.

6. The OLED display screen as claimed in claim 5, wherein the polarizing layer comprises:
   a black photoresist layer disposed correspondingly to the pixel defining layer; and
   a red-green-blue filter layer, disposed correspondingly to the red-green-blue light emitting layer.

7. A manufacturing method of the organic light emitting diode (OLED) display screen according to claim 1, comprising the following steps:
   forming a display panel, wherein a substrate is provided and a functional layer is formed on the substrate;
   forming an encapsulation layer, wherein the encapsulation layer is formed on a surface of the functional layer facing away from the substrate, and
   forming a polarizing layer, wherein the polarizing layer is formed on a surface of the encapsulation layer facing away from the functional layer, and a concave-convex structure is disposed on a surface of the polarizing layer facing away from the encapsulation layer;
   wherein the step of forming the polarizing layer further comprises:
   forming a black photoresist layer, wherein a positive or negative black photoresist layer is applied on the encapsulation layer, and a first mask is used to expose the black photoresist layer for patterning; and a second mask is used to expose a remaining black photoresist layer to form the concave-convex structure on a surface of the remaining black photoresist layer;
   baking the black photoresist layer; and
   forming a red-green-blue filter layer, wherein a positive or negative red-green-blue filter layer is applied on the encapsulation layer, and a third mask is used to expose the red-green-blue filter layer to form the concave-convex structure.

* * * * *